United States Patent
Wu et al.

(10) Patent No.: US 12,058,856 B2
(45) Date of Patent: Aug. 6, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Wei Cheng Wu, Zhubei (TW); Li-Feng Teng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/231,427

(22) Filed: Aug. 8, 2023

(65) Prior Publication Data

US 2023/0380155 A1     Nov. 23, 2023

Related U.S. Application Data

(63) Continuation of application No. 17/135,744, filed on Dec. 28, 2020, now Pat. No. 11,825,651, which is a
(Continued)

(51) Int. Cl.
*H10B 41/42* (2023.01)
*H01L 21/28* (2006.01)
(Continued)

(52) U.S. Cl.
CPC ........ *H10B 41/42* (2023.02); *H01L 29/40114* (2019.08); *H01L 29/42328* (2013.01);
(Continued)

(58) Field of Classification Search
CPC ........ H10B 41/42; H10B 41/30; H10B 41/35; H10B 41/44; H10B 41/47; H10B 43/30;
(Continued)

(56) References Cited

U.S. PATENT DOCUMENTS

| 7,005,345 B2 | 2/2006 | Yaegashi et al. |
| 8,101,477 B1 | 1/2012 | Power |

(Continued)

FOREIGN PATENT DOCUMENTS

| CN | 105321950 A | 2/2016 |
| JP | 2011232623 A | 11/2011 |

(Continued)

OTHER PUBLICATIONS

Notice of Allowance issued Oct. 15, 2018 in U.S. Appl. No. 15/584,314 (16 pages).

(Continued)

*Primary Examiner* — David Vu
*Assistant Examiner* — Brandon C Fox
(74) *Attorney, Agent, or Firm* — STUDEBAKER & BRACKETT PC

(57) ABSTRACT

A semiconductor device includes a non-volatile memory. The non-volatile memory includes a first dielectric layer disposed on a substrate, a floating gate disposed on the dielectric layer, a control gate and a second dielectric layer disposed between the floating gate and the control gate. The second dielectric layer includes one of a silicon oxide layer, a silicon nitride layer and a multi-layer thereof. The first dielectric layer includes a first-first dielectric layer formed on the substrate and a second-first dielectric layer formed on the first-first dielectric layer. The second-first dielectric layer includes a dielectric material having a dielectric constant higher than silicon nitride.

20 Claims, 12 Drawing Sheets

Related U.S. Application Data continuation of application No. 16/427,733, filed on May 31, 2019, now Pat. No. 10,879,253, which is a continuation of application No. 15/428,823, filed on Feb. 9, 2017, now Pat. No. 10,325,918.

(60) Provisional application No. 62/427,389, filed on Nov. 29, 2016.

(51) Int. Cl.

| | | |
|---|---|---|
| *H01L 29/423* | (2006.01) | |
| *H01L 29/66* | (2006.01) | |
| *H10B 41/30* | (2023.01) | |
| *H10B 41/35* | (2023.01) | |
| *H10B 41/44* | (2023.01) | |
| *H10B 41/47* | (2023.01) | |
| *H10B 41/48* | (2023.01) | |
| *H10B 43/30* | (2023.01) | |

(52) U.S. Cl.
CPC .. *H01L 29/42344* (2013.01); *H01L 29/66545* (2013.01); *H10B 41/30* (2023.02); *H10B 41/35* (2023.02); *H10B 41/44* (2023.02); *H10B 41/47* (2023.02); *H10B 41/48* (2023.02); *H10B 43/30* (2023.02)

(58) Field of Classification Search
CPC ......... H01L 29/40114; H01L 29/42328; H01L 29/42344; H01L 29/66545
See application file for complete search history.

(56) References Cited

U.S. PATENT DOCUMENTS

| | | |
|---|---|---|
| 8,669,607 B1 | 3/2014 | Tsair et al. |
| 8,883,592 B2 | 11/2014 | Kotov et al. |
| 9,276,006 B1 | 3/2016 | Chen et al. |
| 9,349,741 B2 | 5/2016 | Liu |
| 9,583,591 B2 | 2/2017 | Chuang et al. |
| 9,583,640 B1 | 2/2017 | Richter et al. |
| 9,634,019 B1 | 4/2017 | Zhou et al. |
| 9,673,338 B2 | 6/2017 | Fan et al. |
| 9,728,544 B2 * | 8/2017 | Yu .......................... H10B 41/30 |
| 9,842,848 B2 | 12/2017 | Wu et al. |
| 9,865,610 B2 | 1/2018 | Chuang et al. |
| 2004/0256657 A1 | 12/2004 | Hung et al. |
| 2006/0108628 A1 | 5/2006 | Hung et al. |
| 2006/0203552 A1 | 9/2006 | Chen et al. |
| 2007/0241386 A1 | 10/2007 | Wang et al. |
| 2008/0029805 A1 | 2/2008 | Shimamoto et al. |
| 2008/0105917 A1 | 5/2008 | Hsieh et al. |
| 2008/0315281 A1 | 12/2008 | Park |
| 2009/0134453 A1 | 5/2009 | Govoreanu et al. |
| 2009/0207662 A1 | 8/2009 | Wang et al. |
| 2010/0184284 A1 | 7/2010 | Kim |
| 2014/0227839 A1 | 8/2014 | Shinohara |
| 2015/0021679 A1 | 1/2015 | Tsair et al. |
| 2015/0060989 A1 | 3/2015 | Loiko et al. |
| 2015/0087123 A1 | 3/2015 | Wu et al. |
| 2015/0137207 A1 | 5/2015 | Chuang et al. |
| 2015/0263010 A1 | 9/2015 | Chuang et al. |
| 2015/0280004 A1 | 10/2015 | Wu et al. |
| 2016/0013197 A1 | 1/2016 | Liu |
| 2016/0013198 A1 | 1/2016 | Liu |
| 2016/0020219 A1 | 1/2016 | Chuang et al. |
| 2016/0064389 A1 | 3/2016 | Mihara |
| 2016/0141296 A1 | 5/2016 | Yang et al. |
| 2016/0163722 A1 | 6/2016 | Chang et al. |
| 2016/0197088 A1 | 7/2016 | Chen et al. |
| 2016/0218195 A1 | 7/2016 | Wu et al. |
| 2016/0225776 A1 | 8/2016 | Chuang et al. |
| 2016/0276354 A1 | 9/2016 | Liu |
| 2016/0293427 A1 | 10/2016 | Mihara et al. |
| 2017/0098654 A1 | 4/2017 | Zhou et al. |
| 2017/0103989 A1 | 4/2017 | Su et al. |
| 2017/0125603 A1 | 5/2017 | Zhou et al. |
| 2017/0162590 A1 | 6/2017 | Chuang et al. |
| 2017/0194336 A1 * | 7/2017 | Lin ................... H01L 29/42372 |
| 2018/0012898 A1 | 1/2018 | Wu et al. |
| 2018/0151580 A1 | 5/2018 | Wu et al. |
| 2018/0151581 A1 | 5/2018 | Wu et al. |
| 2018/0151707 A1 | 5/2018 | Wu et al. |
| 2018/0254281 A1 | 9/2018 | Bo et al. |

FOREIGN PATENT DOCUMENTS

| | | | |
|---|---|---|---|
| JP | 2011233623 | A | 11/2011 |
| JP | 2012248652 | A | 12/2012 |
| JP | 2016-051735 | A | 4/2016 |
| KR | 10-2015-0056441 | A | 5/2015 |
| TW | 546842 | B | 8/2003 |
| TW | 200746369 | A | 12/2007 |
| TW | 200816391 | A | 4/2008 |
| TW | 201547008 | A | 12/2015 |
| TW | 201640621 | A | 11/2016 |

OTHER PUBLICATIONS

Non-final Office Action issued Apr. 13, 2018 in U.S. Appl. No. 15/584,314 (18 pages).
Non-final Office Action issued Nov. 1, 2018 in U.S. Appl. No. 15/648,201 (29 pages).
Notice of Reason for Refusal issued Oct. 3, 2018 in corresponding Korean Application No. 10-2017-0097516, including English translation (13 pages).
Office Action issued in corresponding German Patent Application No. 10 2017 103 838.8, dated Aug. 22, 2017.
Non-final Office Action issued in related U.S. Appl. No. 15/428,823, dated Jul. 14, 2017.
Final Office Action issued in related U.S. Appl. No. 15/428,823, dated Jan. 25, 2018.
Notice of Allowance issued in related U.S. Appl. No. 15/428,823, dated Aug. 6, 2018.
Office Action issued Mar. 22, 2018 in corresponding German Patent Application No. 10 2017 116 221.6 (8 pages).
Office Action issued in U.S. Appl. No. 15/428,823, dated Jan. 25, 2018.
Notice of Allowance issued Aug. 6, 2018 in U.S. Appl. No. 15/428,823 (15 pages).
Office Action issued in corresponding U.S. Appl. No. 15/428,823 dated Jul. 14, 2017.
Office Action issued in corresponding Korean Patent Application No. 10-2017-0123215, dated Nov. 30, 2018.
Notice of Allowance issued in related U.S. Appl. No. 15/584,314, dated Dec. 18, 2018.
Non-final Office Action issued in related U.S. Appl. No. 15/648,201, dated Jun. 13, 2019.
Notice of Allowance issued in corresponding Korean Application No. 10-2017-0097516, dated Nov. 25, 2019, with English translation.
Final Office Action issued in corresponding U.S. Appl. No. 16/427,733 dated Apr. 14, 2020.
Non-Final Office Action issued in corresponding U.S. Appl. No. 16/368,814, dated Apr. 28, 2020.
Non-Final Office Action issued in corresponding U.S. Appl. No. 15/648,201, dated May 14, 2020.
Notice of Allowance issued in related U.S. Appl. No. 16/203,352, dated Jul. 22, 2020.
Notice of Allowance issued in related U.S. Appl. No. 16/427,733, dated Jul. 16, 2020.
Non-final Office Action issued in U.S. Appl. No. 16/427,733, dated Sep. 20, 2020.
Final Office Action issued in U.S. Appl. No. 16/427,733, dated Apr. 15, 2020.
Notice of Allowance issued in U.S. Appl. No. 16/427,733, dated Oct. 30, 2020.

(56) References Cited

OTHER PUBLICATIONS

Notice of Allowance issued in U.S. Appl. No. 17/135,744, dated Jul. 12, 2023.
Non-Final Office Action issued in U.S. Appl. No. 17/135,744, dated Sep. 30, 2022.

* cited by examiner

SEMICONDUCTOR DEVICE AND MANUFACTURING METHOD THEREOF

CROSS-REFERENCE TO RELATED APPLICATIONS

This application is a continuation of U.S. patent application Ser. No. 17/135,744 filed Dec. 28, 2020, which is a continuation of U.S. patent application Ser. No. 16/427,733 filed May 31, 2019, now U.S. Pat. No. 10,879,253, which is a continuation of U.S. patent application Ser. No. 15/428,823 filed Feb. 9, 2017, now U.S. Pat. No. 10,325,918, which claims priority to U.S. Provisional Patent Application 62/427,389 filed Nov. 29, 2016, the entire disclosure of which is incorporated herein by reference.

TECHNICAL FIELD

The disclosure relates to semiconductor integrated circuits, more particularly to semiconductor devices including non-volatile memory cells and peripheral circuits, and manufacturing processes thereof.

BACKGROUND

As the semiconductor industry has progressed into nanometer technology process nodes in pursuit of higher device density, higher performance, and lower costs, there have been challenges in reducing contact resistance and suppressing an increase of the number of lithography operations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
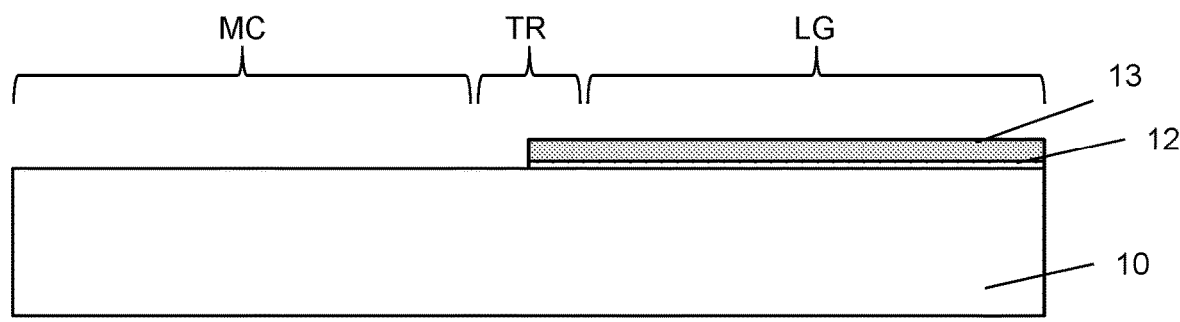
FIGS. 1A-1D show exemplary cross sectional views illustrating a sequential process for manufacturing a semiconductor device including non-volatile memory cells and peripheral logic circuits according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral circuits such as logic circuits. The peripheral circuits may also include static random access memories (SRAMs). The NVM cells generally require a stacked structure in which plural layers, such as polysilicon layers, are stacked, while the peripheral logic circuits generally include field effect transistors (FETs) having a single polysilicon layer. Because of the structure differences, when, for example, an interlayer dielectric (ILD) layer is formed over the NVM cells and the peripheral logic circuits, there is a height difference in the ILD layer between an NVM cell area and a peripheral logic circuit area. Such a height difference may affect the performance of chemical mechanical polishing (CMP) on the ILD layer.

In the present disclosure, before fabricating the NVM cells and the peripheral logic circuits, a substrate in the NVM cell area is etched to make a "step" between the NVM cell area and the peripheral logic circuit area. The step height corresponds to the height difference when the ILD layer is formed if the step is otherwise not formed. Further, it is also noted that placement of devices should be avoided near the step.

FIGS. 1A-8C generally show exemplary cross sectional views illustrating a sequential process for manufacturing a semiconductor device including non-volatile memory cells and peripheral logic circuits according to one embodiment of the present disclosure. It is understood that additional operations can be provided before, during, and after processes shown by FIGS. 1A-8C, and some of the operations described below can be replaced or eliminated, for additional embodiments of the method.

As shown in FIG. 1A, a mask layer including, for example, a pad oxide layer 12 and a nitride layer 13 formed on the pad oxide layer 12 is formed on the substrate 10. A photo resist pattern is formed over the nitride layer 13 by a lithography operation so as to cover the peripheral logic circuit area LG. By using the photo resist pattern as an etching mask, the NVM cell area MC is exposed, while the peripheral logic circuit area LG is covered by the nitride layer 13 and pad oxide layer 12. As shown in FIG. 1A, a transition area TR exists between the NVM cell area MC and the peripheral logic circuit area LG.

In one embodiment, the substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate. In some embodiments, the pad oxide layer 12 is thermally grown silicon oxide, and the nitride layer 13 is silicon nitride. The silicon oxide and the silicon nitride can be formed by using a furnace or chemical vapor deposition (CVD). Materials for the mask layer are not limited to silicon oxide and silicon nitride, and any other suitable material for a mask layer may be used. The thickness of the pad oxide layer 12 is in a range from about 3 nm to about 20 nm and the thickness of the nitride layer 13 is in a range from about 20 nm to about 200 nm in some embodiments.

Figure 1B:
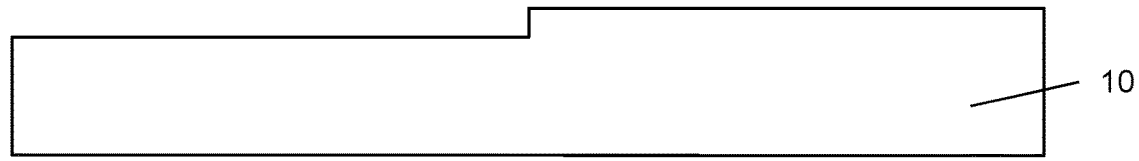

After the mask layer is patterned, the NVM cell area MC is oxidized by using wet oxidation, thereby forming an oxide layer, and then the oxide layer is removed by using wet etching, thereby forming a step between the NVM cell area MC and the peripheral logic circuit area LG. Then, the nitride layer 13 and pad oxide layer 12 are removed, as shown in FIG. 1B.

In certain embodiments, by using the pad oxide layer 12 and the nitride layer 13 as an etching mask, the substrate 10 in the NVM cell area MC is etched to form the step.

Figure 1C:
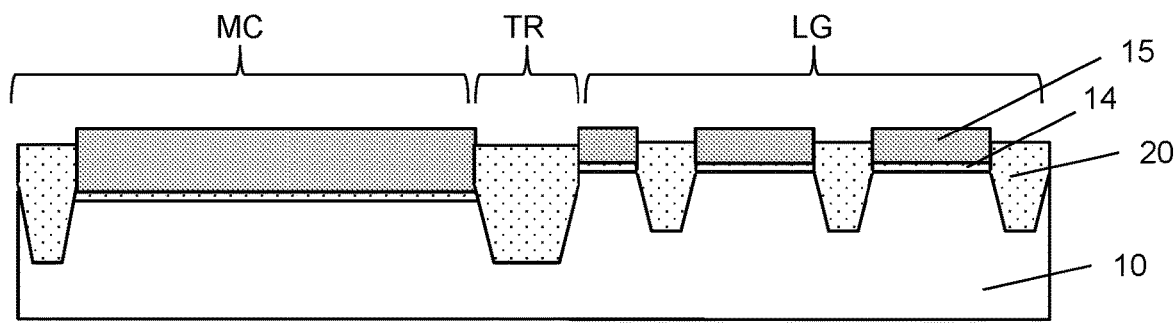
Figure 1D:
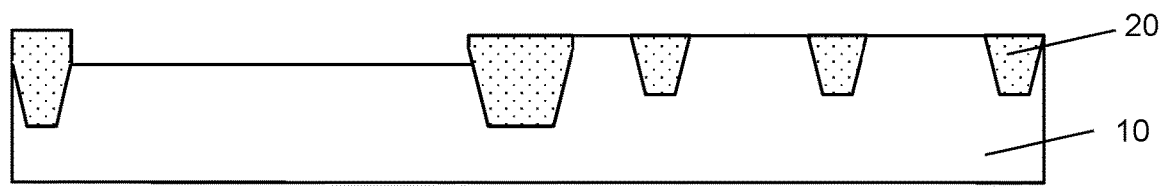

After the "step" is formed, isolation insulating layers 20, which are also called shallow trench isolations (STI), are formed, as shown in FIGS. 1C and 1D. To form the isolation insulating layers 20, a mask layer including a silicon oxide layer 14 and a silicon nitride layer 15 is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

The trenches are filled with an insulating (dielectric) material such as silicon oxide, and then, a planarization operation, such as CMP or an etch-back process, is performed so as to remove an upper part of the insulating material layer, thereby forming the isolation layers 20. The substrate not etched, and surrounded or separated by shallow trench isolation (STI) made of insulating material, such as silicon oxide, in plan view is an active region, over which transistors or other semiconductor devices are formed. As shown in FIGS. 1C and 1D, the NVM cell area MC and the peripheral logic circuit area LG may be separated by a relatively large isolation layer 20 in the transition area TR. Of course, after the isolation layers 20 are formed, the step between the cell area and the peripheral logic circuit area is maintained.

Further, the mask layer including a silicon oxide layer 14 and a silicon nitride layer 15 is removed, and then an additional planarization operation is performed to adjust the height of the isolation layers 20 in the peripheral logic circuit area LG, as shown in FIG. 1D. In certain embodiment, this additional planarization operation is not performed.

Figure 2A:
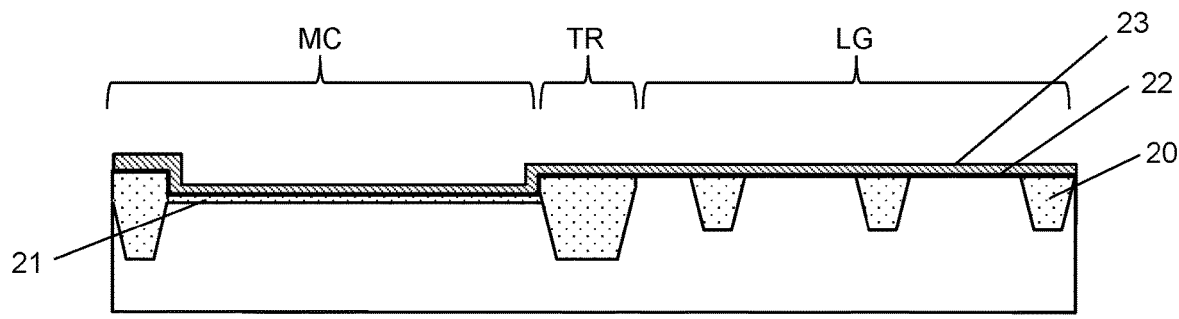
FIGS. 2A-2D show exemplary cross sectional views illustrating a sequential process for manufacturing a semiconductor device including non-volatile memory cells and peripheral logic circuits according to one embodiment of the present disclosure.

Subsequently, as shown in FIG. 2A, a first dielectric layer 21 is formed over the substrate 10 in the NVM cell area MC. The first dielectric layer 21 is utilized as a tunnel oxide layer for NVM cells and is made of silicon oxide. The thickness of the first dielectric layer 21 is in a range from about 1 nm to about 50 nm in some embodiments. The first dielectric layer 21 can be formed by thermal oxidation or CVD.

After the first dielectric layer 21 is formed, a second dielectric layer 23 is formed over the NVM cell area MC and the logic circuit area LG. In some embodiments, an interfacial silicon oxide layer 22 is formed before forming the second dielectric layer 23. In such a case, the combination of the layers 22 and 23 may be referred to as the second dielectric layer. The thickness of the interfacial silicon oxide layer 22 is in a range from about 1 nm to about 10 nm in some embodiments.

The second dielectric layer 23 includes one or more layers of a high-k dielectric material having a dielectric constant higher than silicon nitride. Typically, the dielectric constant of the high-k dielectric material is 10 or more. In some embodiments, the second dielectric layer 23 includes one or more oxides of Hf, Y, Ta, Ti, Al and Zr, or any other suitable dielectric material. In certain embodiments, $HfO_2$ is used.

The second dielectric layer 23 can be formed by CVD. The thickness of the second dielectric layer 23 is in a range from about 1 nm to about 50 nm in some embodiments. The second dielectric layer 23 is utilized as a gate dielectric layer for field effect transistors (FETs) of logic circuits in the logic circuit area LG.

Figure 2B:
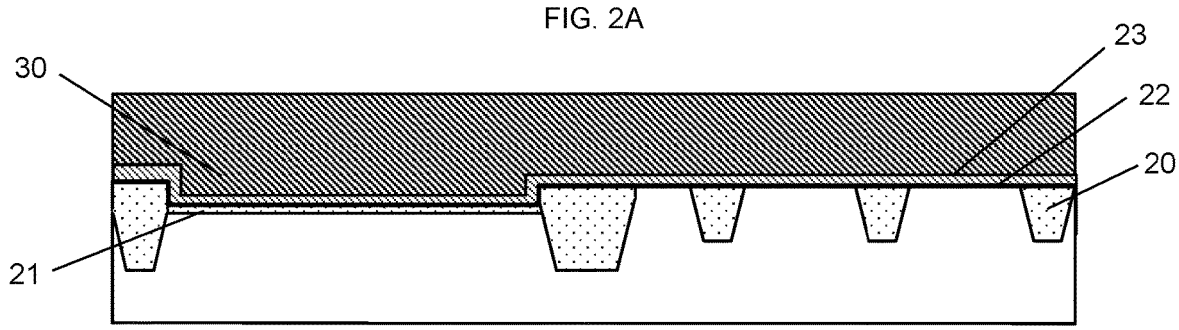

After the second dielectric layer 23 is formed, a first polysilicon layer 30 is formed, as shown in FIG. 2B. The first polysilicon layer 30 can be formed by CVD. The thickness of the first polysilicon layer 30 as deposited is in a range from about 10 nm to about 300 nm in some embodiments. The first polysilicon layer 30 is appropriately doped with impurities and is utilized for floating gates of NVM cells. The poly silicon layer 30 may be replaced with an amorphous silicon layer.

Figure 2C:
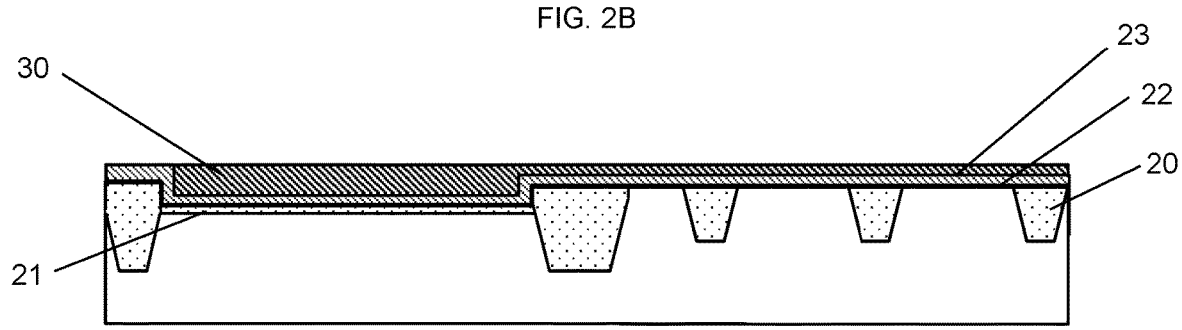

In some embodiments, as shown in FIG. 2C, the thickness of the first polysilicon layer 30 as deposited is reduced by a planarization operation, such as a chemical mechanical polishing method or an etch-back method. After the planarization operation, the thickness of the first polysilicon layer 30 is in a range from about 10 nm to about 200 nm in some embodiments. As shown in FIG. 2C, the first polysilicon layer 30 remains in the logic circuit area LG. In certain embodiments, the first polysilicon layer 30 is completely removed in the logic circuit area LG.

Figure 2D:
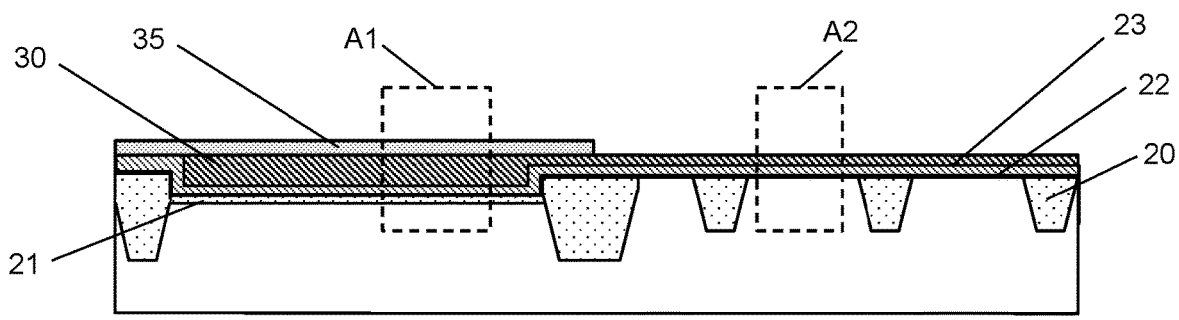

After the planarization operation, a third dielectric layer 35 is formed in the NVM cell area MC, as shown in FIG. 2D. In some embodiments, the third dielectric layer 35 includes one of a silicon oxide layer, a silicon nitride layer and a multi-layer thereof, having thicknesses of about 10-100 nm. The third dielectric layer 35 can be formed by CVD and patterning operations including lithography and dry etching. As shown in FIG. 2D, the third dielectric layer 35 is not formed in the logic circuit area LG.

Figure 3A:
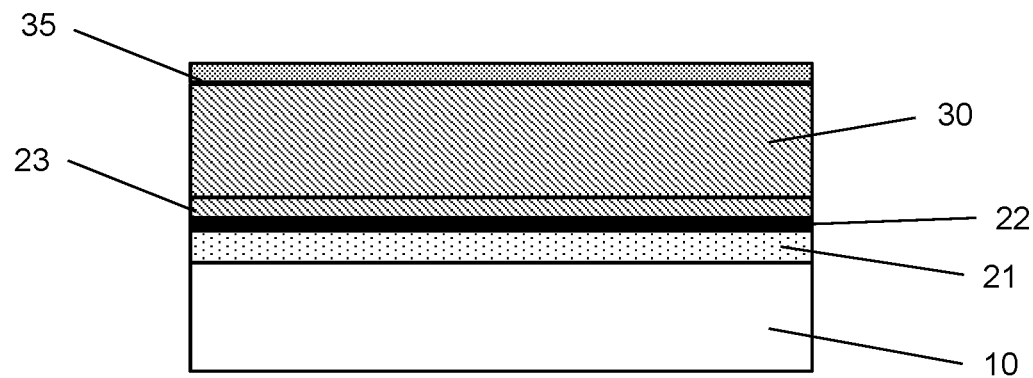
FIGS. 3A and 3B show enlarged cross sectional views illustrating stacked structures corresponding to areas A1 and A2 of FIG. 2D, respectively.
Figure 3B:
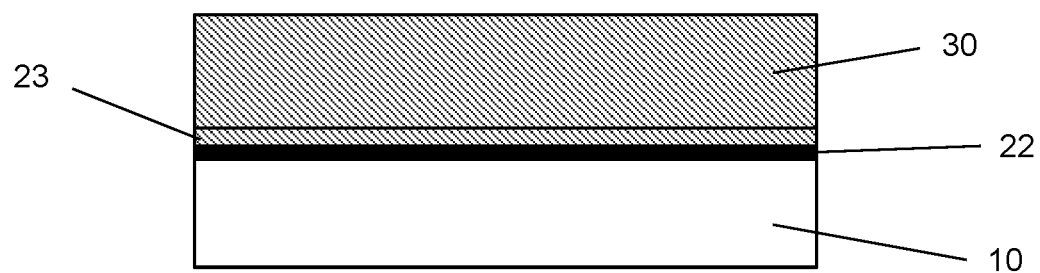

FIGS. 3A and 3B show exemplary cross sectional views illustrating stacked structures corresponding to areas A1 and A2 of FIG. 2D, respectively.

At this stage of the manufacturing process, in the NVM cell area MC, the dielectric film 35, the first polysilicon layer 30, high-k dielectric layer 23, the interfacial silicon oxide layer 22 and the tunnel silicon oxide layer 21 are stacked on the substrate 10, as shown in FIG. 3A. In the actual device, the interface between the interfacial silicon oxide layer 22 and the tunnel silicon oxide layer 21 may not be observed, as they are formed by the same material. In the logic circuit area LG, the first polysilicon layer 30, high-k dielectric layer 23 and the interfacial silicon oxide layer 22 are stacked on the substrate 10, as shown in FIG. 3B.

Figure 4A:
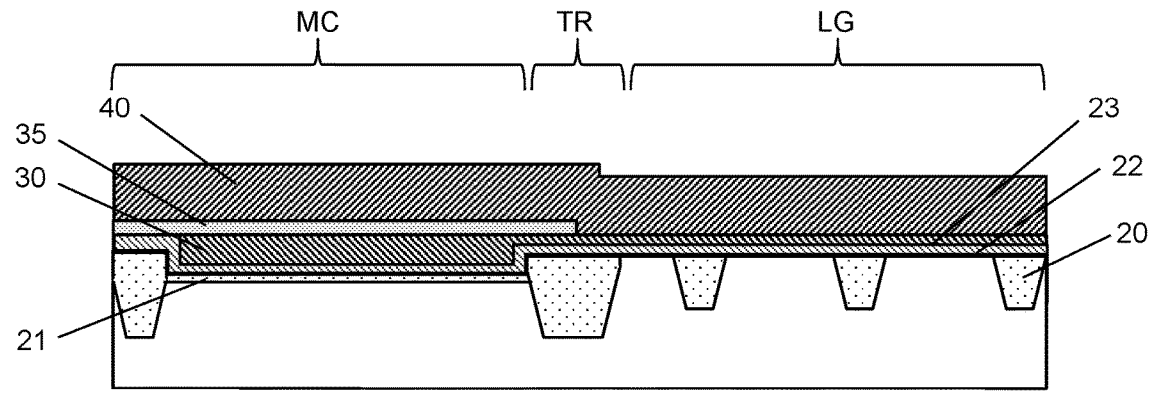
FIGS. 4A, 4B, 4C and 4D show exemplary cross sectional views illustrating a sequential process for manufacturing a semiconductor device including non-volatile memory cells and peripheral logic circuits according to one embodiment of the present disclosure.

Subsequent to FIG. 2D, a second polysilicon layer 40 is formed over the NVM cell area MC and the logic circuit area LG, as shown in FIG. 4A. The second polysilicon layer 40 can be formed by CVD, and the thickness of the second polysilicon layer 40 is in a range from about 10 nm to about 100 nm, in some embodiments.

Figure 4B:
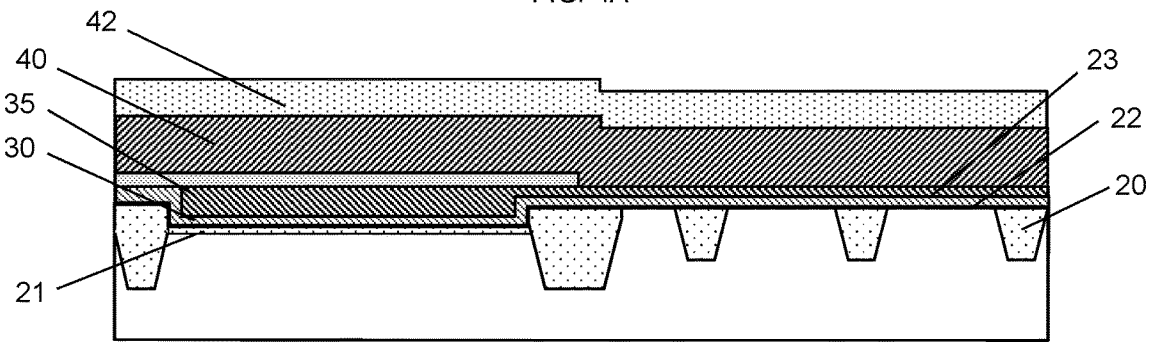

Further, as shown in FIG. 4B, a hard mask layer 42 is formed on the second polysilicon layer 40. In some embodiments, the hard mask layer 42 is made of silicon oxide formed by CVD, and the thickness thereof is in a range from about 10 nm to about 50 nm.

Figure 4C:
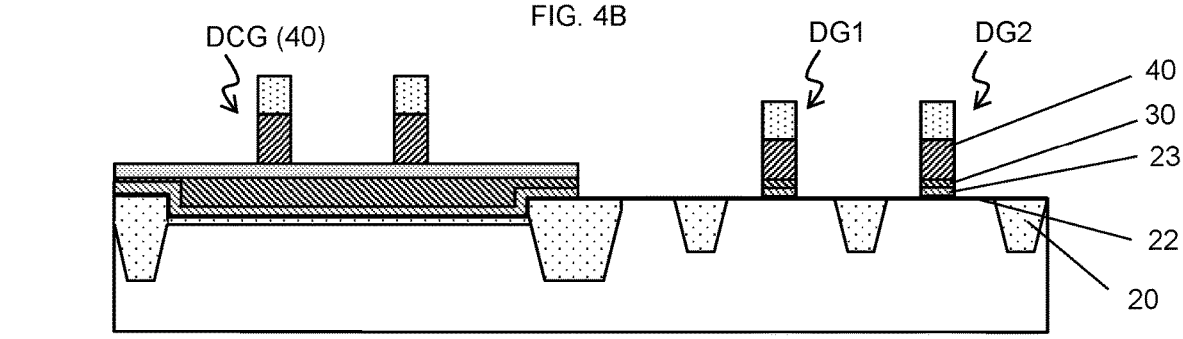

By using a patterning operation including lithography and etching, the hard mask layer 42 is patterned, and by using the patterned hard mask layer as an etching mask, the second polysilicon layer 40 is patterned as shown in FIG. 4C.

In the NVM cell area MC, the etching of the second polysilicon layer 40 substantially stops at the third dielectric layer 35, while in the logic circuit area LG, the etching of the second polysilicon layer 40 also etches high-k dielectric layer 23 and stops at the interfacial silicon oxide layer 22. By this etching operation, dummy control gates DCG formed by the second polysilicon layer 40 are formed in the NVM cell area MC, and a first dummy gate DG1 and a second dummy gate DG2, both formed by the second polysilicon layer 40, are formed in the logic circuit area LG. In this disclosure, "dummy" generally means a layer or a structure that is subsequently removed or replaced with another material, or a layer or a structure which does not function as a part of an active circuit. However, even if not mentioned as dummy, some layers may be subsequently replaced with another layer/material.

Figure 4D:
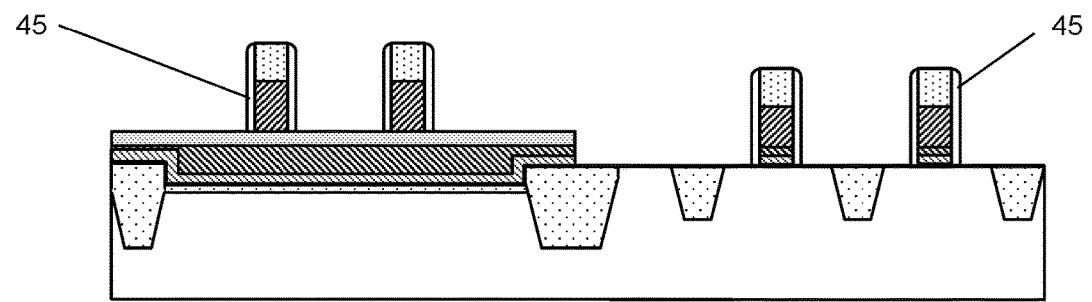

After the patterning operation of the second polysilicon layer 40, first sidewall spacers 45 are formed on both sides of the patterned second polysilicon layers both in the NVM cell area MC and in the logic circuit area LG, as shown in FIG. 4D.

The first sidewall spacers 45 are made of silicon oxide in some embodiments. A blanket layer of silicon oxide is formed, for example by CVD, over the entire substrate and then anisotropic etching is performed, thereby forming the first sidewall spacers 45. The thickness of the first sidewall spacers 45 is in a range from about 1 nm to about 20 nm in some embodiments.

Figure 5A:
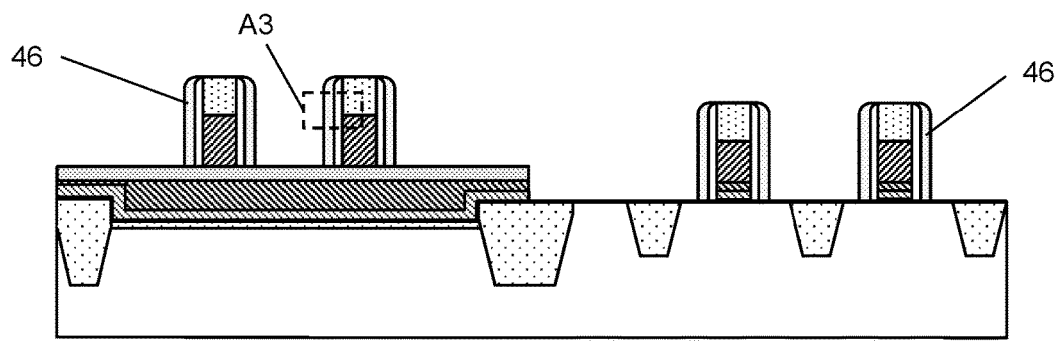
FIGS. 5A, 5C and 5D show exemplary cross sectional views illustrating a sequential process for manufacturing a semiconductor device including non-volatile memory cells and peripheral logic circuits according to one embodiment of the present disclosure.
Figure 5B:
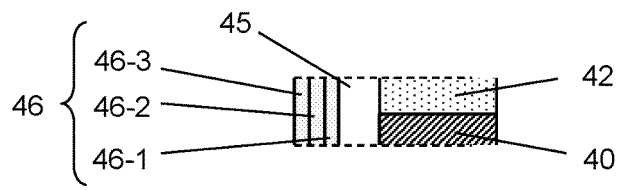
FIG. 5B is an enlarged cross sectional view illustrating a stacked structure corresponding to area A3 of FIG. 5A.

Further, as shown in FIG. 5A, after the first sidewall spacers 45 are formed, second sidewall spacers 46 are formed over the first sidewall spacers. In some embodiments, the second sidewall spacers 46 include an ONO film having a silicon nitride layer 46-2 sandwiched by two silicon oxide layers 46-1 and 46-3, as shown in FIG. 5B, which is an enlarged cross sectional view corresponding to area A3 of FIG. 5A. The thicknesses of the silicon oxide layer 46-1, the silicon nitride layer 46-2 and the silicon oxide layer 46-3 are in ranges about 1-20 nm, about 1-30 nm and about 1-20 nm, respectively, in some embodiments. In certain embodiments, the second sidewall spacers 46 are a single layer of silicon nitride or silicon oxynitride.

Figure 5C:
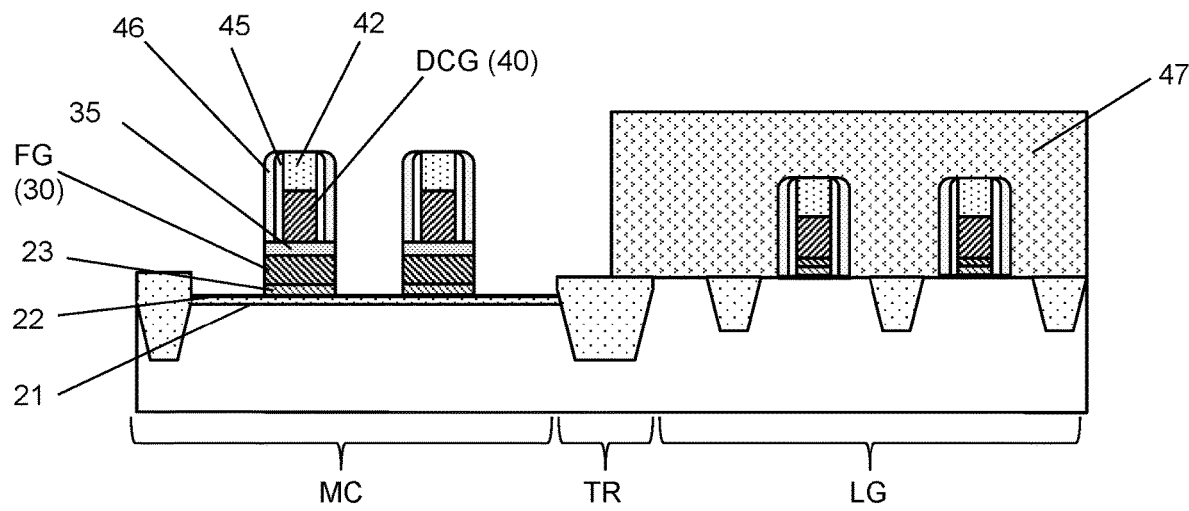

After the second sidewall spacers 46 are formed, the third dielectric layer 35 and the first polysilicon layer 30 are patterned by using dry etching operations, while the logic circuit area LG is covered by a protective layer 47, as shown in FIG. 5C. The etching of the first polysilicon layer also removes the second dielectric layer 23 and stops at the interfacial silicon oxide layer 22. The protective layer 47 may be a photo resist layer, and after the etching of the first polysilicon layer 40, the protective layer 47 is removed.

Figure 5D:
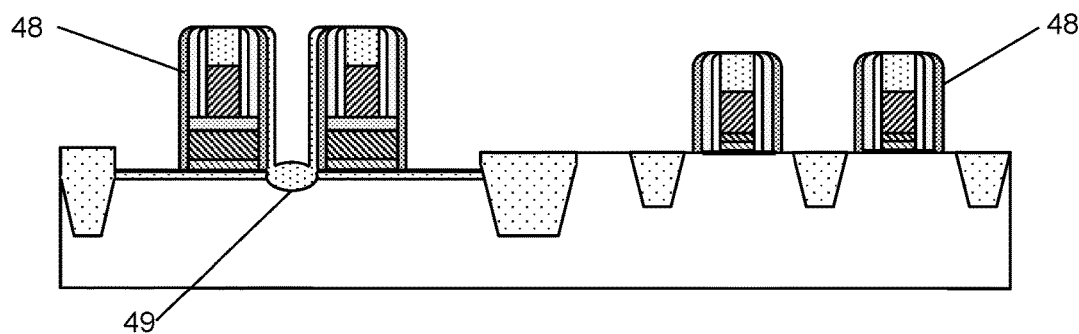

Further, as shown in FIG. 5D, third sidewall spacers 48 are formed, and an erase-gate oxide 49 is formed. The third sidewall spacers 48 are made of one or more layers of dielectric material. In one embodiment, the third sidewall spacers 48 are made of silicon nitride. The erase-gate oxide 49 is made of silicon oxide. In some embodiments, a silicon oxide layer is formed and then the silicon oxide layer is patterned to remove the silicon oxide layer from an erase gate area, and then wet oxidation is performed, thereby forming the erase-gate oxide 49. At this stage of the manufacturing process, in the NVM cell area MC, the first dielectric layer 21, the interfacial layer 22, the second dielectric layer 23, the first polysilicon layer 30 as a floating gate (FG), the third dielectric layer 35, the second polysilicon layer 40 and the hard mask layer 42 constitute stacked structures with sidewall spacers. In the logic circuit area LG, the interfacial layer 22, the second dielectric layer 23, the first polysilicon layer 30 as a dummy layer, the second polysilicon layer 40 as another dummy layer and the hard mask layer 42 with sidewall spacers constitute the first and second gate stacks. In some embodiments, if the first dielectric layer 21, the interfacial layer 22 and the second dielectric layer 23 are etched during the aforementioned etching, a new dielectric layer is formed for a gate dielectric layer of select gates.

Figure 6A:
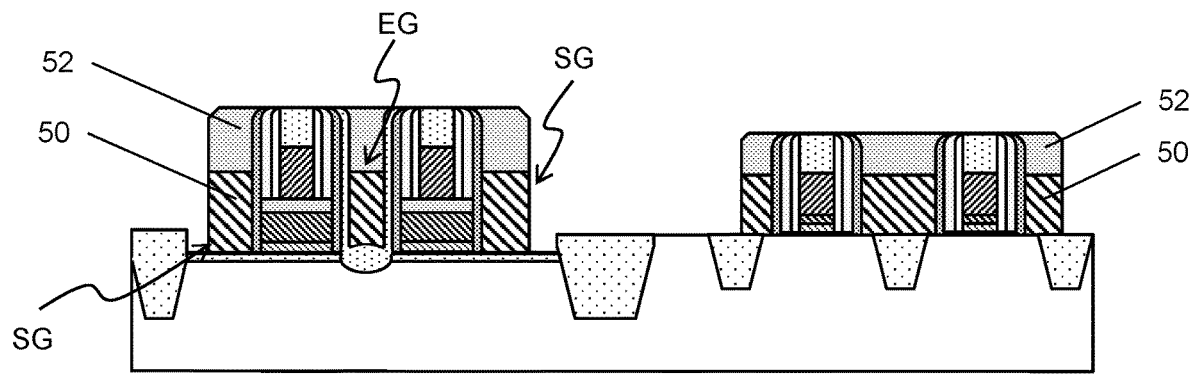
FIGS. 6A, 6B and 6C show exemplary cross sectional views illustrating a sequential process for manufacturing a semiconductor device including non-volatile memory cells and peripheral logic circuits according to one embodiment of the present disclosure.
Figure 6B:
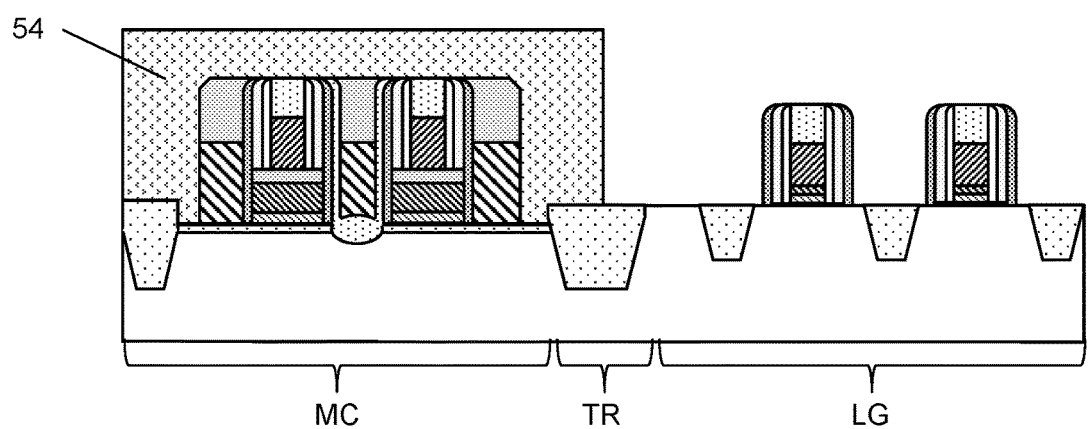

Then, in the NVM cell area MC, an erase gate EG is formed between the stacked structures and select gates SG are formed at sides of the stacked structures at which the erase gate is not formed, as shown in FIG. 6A. A third polysilicon layer 50 is formed over the NVM cell area MC and the logic circuit area LG, and a hard mask layer 52 is formed on the third polysilicon layer. Then, patterning operations are performed to form the erase gate EG and the select gates (word lines) SG, as shown in FIG. 6A. In the logic circuit area LG, similar structures may be formed on sides of the first and second gate stacks. The thickness of the third polysilicon layer 50 for the erase gate EG and the select gates SG is in a range from about 40 nm to about 200 nm in some embodiments. The hard mask layer 52 is made of one or more layers of silicon oxide, silicon nitride and silicon oxynitride, and has a thickness of about 20 nm to 100 nm in some embodiments.

Subsequently, the hard mask layer 52 and the third polysilicon layer 50 are removed in the logic circuit area LG, while the NVM cell area MC is protected by a cover layer 54. In some embodiments, the cover layer 54 is a photo resist layer.

Figure 6C:
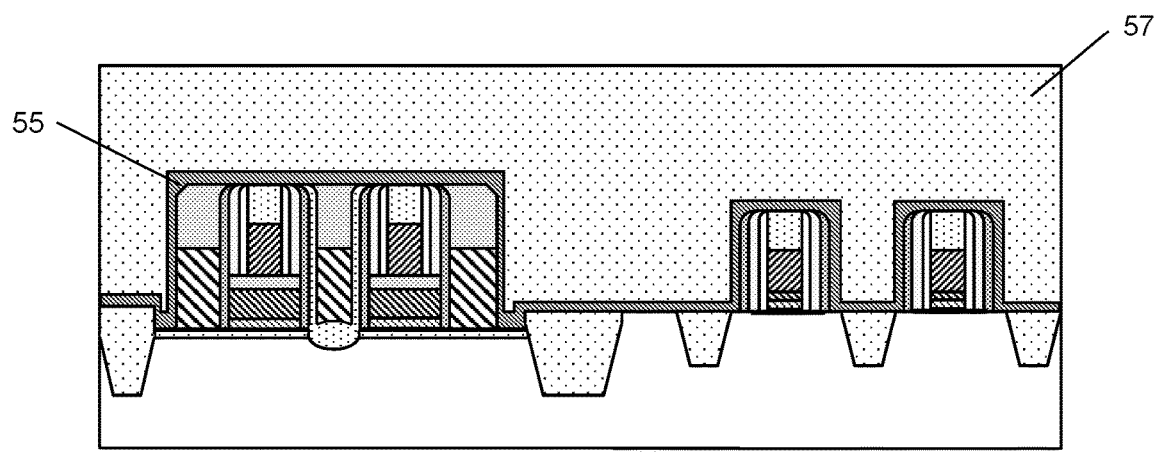

After the hard mask layer 52 and the third polysilicon layer 50 are removed in the logic circuit area LG, a silicon nitride cover layer 55 is formed over the NVM cell area MC and the logic circuit area LG, and further a fourth dielectric layer 57 is formed on the silicon nitride cover layer 55, as shown in FIG. 6C.

The silicon nitride cover layer 55 can be formed by CVD, and has a thickness of about 1 nm to about 50 nm in some embodiments. The fourth dielectric layer 57 includes one or more layers of $SiO_2$, SiN, SiOC, SiCN, SiOCN, SiON or any other suitable dielectric material and can be formed by CVD. The thickness of the fourth dielectric layer 57 is in a range from about 50 nm to about 1000 nm so that the structures on the NVM cell area MC and the logic circuit area LG are fully embedded in the fourth dielectric layer 57.

Figure 7A:
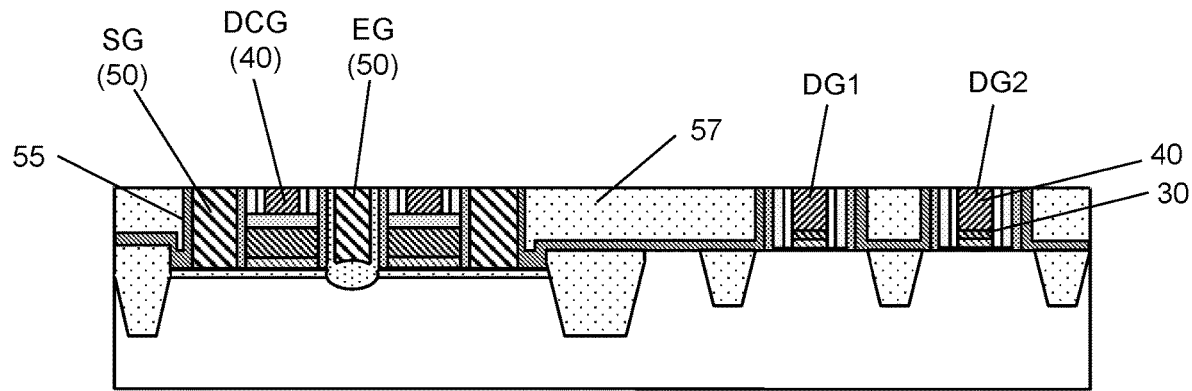
FIGS. 7A, 7B and 7C show exemplary cross sectional views illustrating a sequential process for manufacturing a semiconductor device including non-volatile memory cells and peripheral logic circuits according to one embodiment of the present disclosure.

After the fourth dielectric layer 57 is formed, as shown in FIG. 7A, the fourth dielectric layer and the upper portions of the stacked structures in the NVM cell area MC and the gate stacks in the logic circuit area LG are planarized by CMP. By the planarization operation using CMP, the upper portions of the erase gate EG and the select gates SG made of the third polysilicon layer 50, the upper portions of the dummy control gates DCG made of the second polysilicon layer 40, and the upper portions of the dummy gates DG1, DG2 made of the second polysilicon layer 40 are exposed, as shown in FIG. 7A.

Figure 7B:
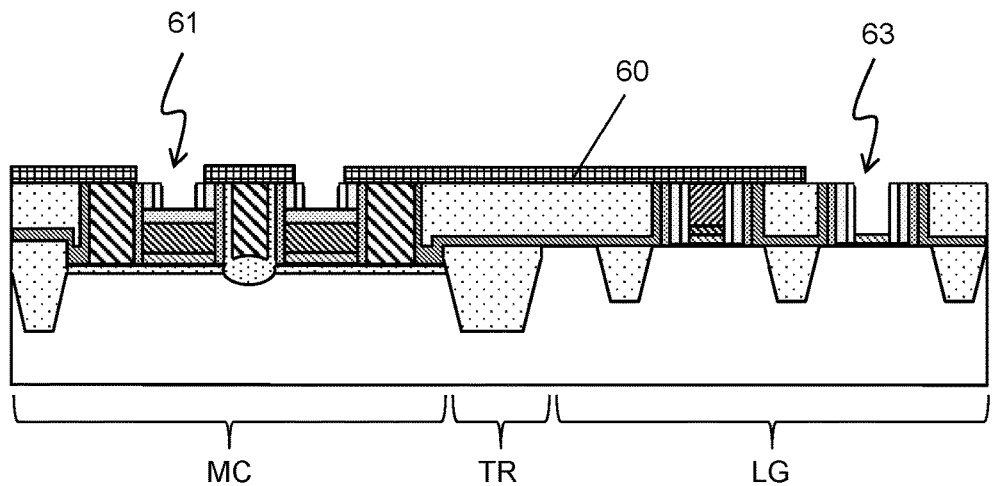

Next, as shown in FIG. 7B, a first mask pattern 60 is formed so that the upper portions of the dummy control gates DCG, and the upper portion of the dummy gate DG2 are exposed from the first mask pattern 60. The first mask pattern 60 is made of a photo resist in some embodiments, and is made of silicon nitride, aluminum oxide or transition metal nitride in other embodiments. Then, the second polysilicon layers 40 of the dummy control gates DCG and the second polysilicon layer 40 and the first polysilicon layer 30 of the dummy gate DG2 are removed so as to form openings 61 and 63, respectively, as shown in FIG. 7B.

Figure 7C:
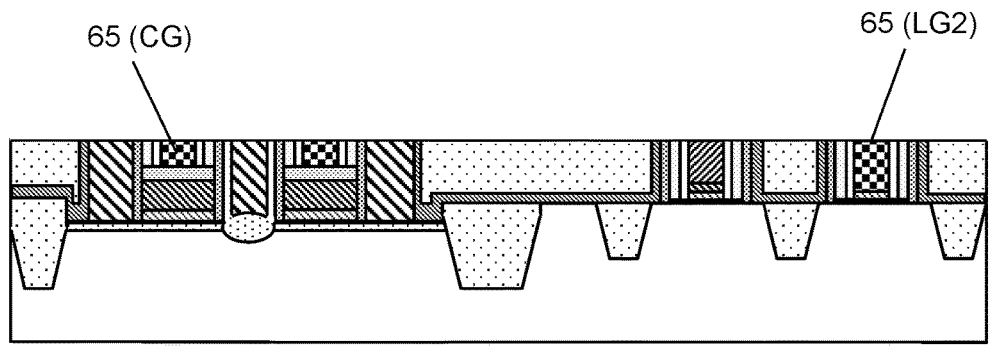

After the openings 61 and 63 are formed, the openings are filled with one or more layers of first conductive material 65, as shown in FIG. 7C. In some embodiments, the first conductive material 65 includes a work function adjustment layer and a body metal layer.

In the present disclosure, the dummy gate DG1 is for either one of a p-channel FET and an n-channel FET and the dummy gate DG2 is for the other one of the p-channel FET and the n-channel FET. For the n-channel FET, one or more of TaN, TaAlC, TiN, TiC, Co, TiAl, HfTi, TiSi, TaSi or any other suitable conductive material is used as the work function adjustment layer, and for the p-channel FET, one or more of TiAlC, Al, TiAl, TaN, TaAlC, TiN, TiC, Co or any other suitable conductive material is used as the work function adjustment layer. In this embodiment, the work function adjustment layers for the p-channel FET and the n-channel FET are different from each other. The body metal layer for the p-channel FET and the n-channel FET may be the same or different, and includes one or more of Al, Cu, W, Ti, Ta, TiN, TiAl, TiAlC, TiAlN, TaN, NiSi, CoSi, and any other suitable conductive materials.

In one embodiment of the present disclosure, the dummy gate DG2 is for a p-channel FET. Thus, the structure of the first conductive material 65 for the control gate CG is the same as that of the gate LG2 of the p-channel FET.

The conductive material layer 65 can be formed by depositing a thick conductive material layer, and performing planarization operations, such as CMP so as to remove the conductive material layer deposited on the upper surface of the first mask pattern 60. The first mask pattern 60 is also removed during the CMP.

Figure 8A:
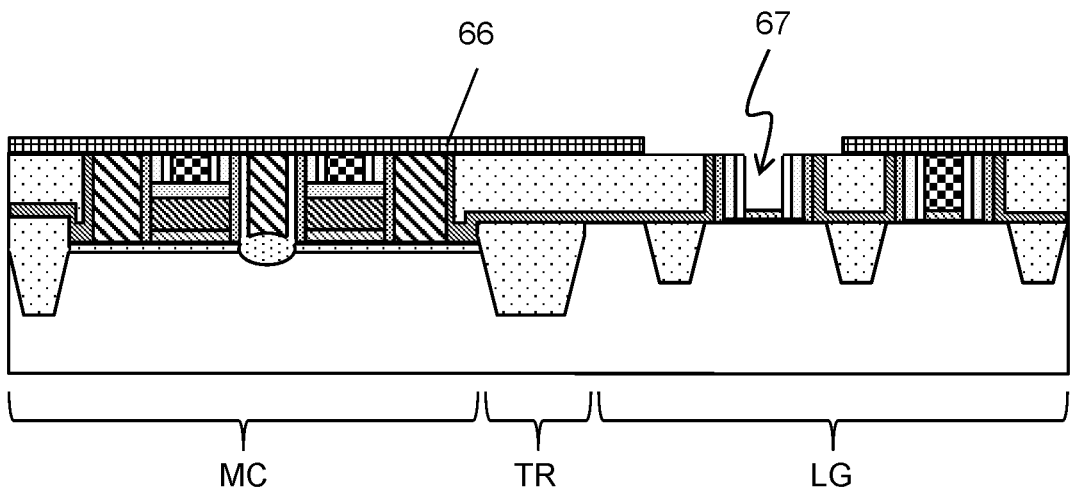
FIGS. 8A, 8B and 8C show exemplary cross sectional views illustrating a sequential process for manufacturing a semiconductor device including non-volatile memory cells and peripheral logic circuits according to one embodiment of the present disclosure.
Figure 8B:
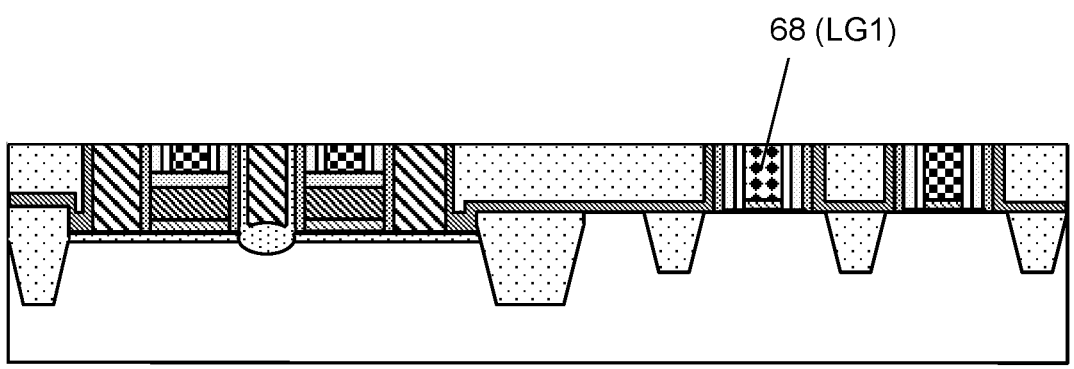

Then, as shown in FIG. 8A, a second mask pattern 66 is formed so that the upper portion of the dummy gate DG1 is exposed from the second mask pattern 66. The second mask pattern 66 is made of a photo resist in some embodiments, and is made of silicon nitride, aluminum oxide or transition metal nitride in other embodiments. Then, the second polysilicon layer 40 and the first polysilicon layer 30 of the dummy gate DG1 are removed so as to form opening 67, as shown in FIG. 8B. Then, similar to the operations of FIG. 7C, the second conductive material layer 68 is formed in the opening 67 so as to form a metal gate LG1 for an n-channel FET.

Figure 8C:
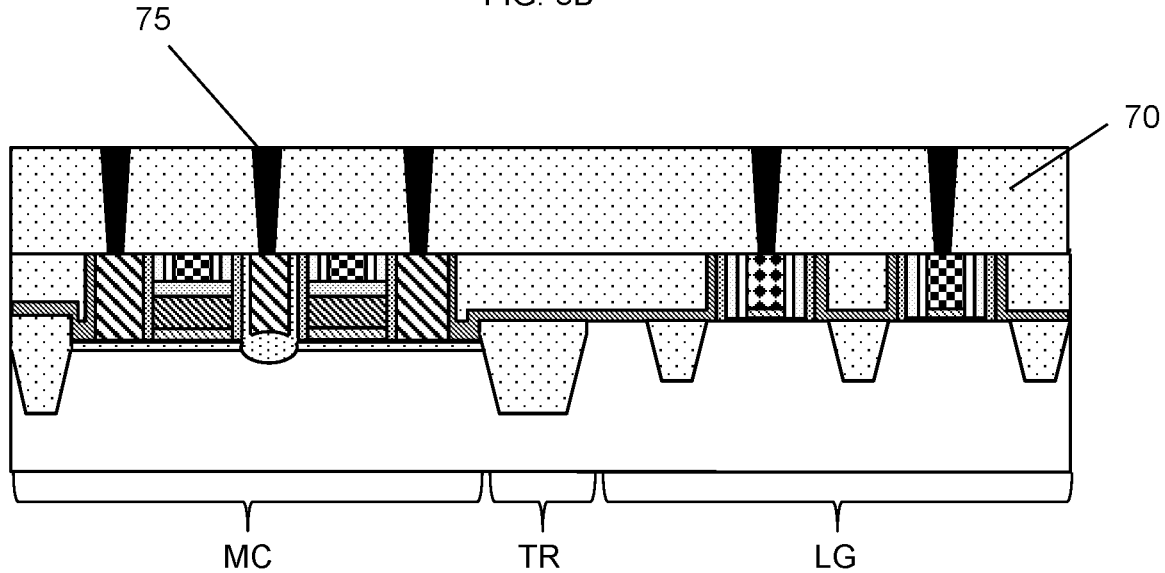

Subsequently, as shown in FIG. 8C, an interlayer dielectric (ILD) layer 70 is formed over the structure shown in FIG. 8B, and contact plugs 75 are formed. The ILD layer 70 includes one or more layers of silicon based insulating material, such as $SiO_2$, SiN, SiOC, SiCN, SiOCN, SiON or any other suitable dielectric material formed by CVD. The thickness of the ILD layer 70 is in a range from about 100 nm to about 1000 nm in some embodiments. The contact plugs 75 are made of conductive material including one or more of Al, Cu, W, Ti, Ta, TiN, TiAl, TiAlC, TiAlN, TaN, NiSi, CoSi, and any other suitable conductive materials. Although not shown in FIG. 8C, contact plugs 75 are also disposed on the control gates.

FIGS. 9A-9C and 10A-10B show exemplary cross sectional views illustrating a sequential process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-8C may be employed in the following embodiment, and the detailed explanation thereof may be omitted. In the following embodiment, the erase gate EG and select gates SG formed by the polysilicon layer 50 are dummy gates.

Figure 9A:
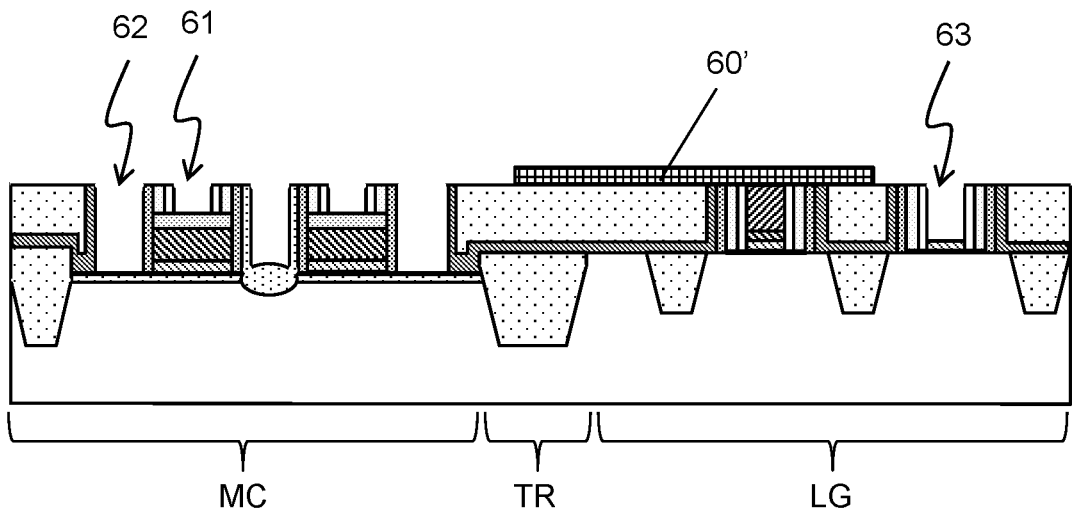
FIGS. 9A, 9B and 9C show exemplary cross sectional views illustrating a sequential process for manufacturing a semiconductor device including non-volatile memory cells and peripheral logic circuits according to another embodiment of the present disclosure.

After the structure of FIG. 7A is formed, a first mask pattern 60' is formed so that the upper portions of the dummy control gates DCG, the erase gate EG and select gates SG and the upper portion of the dummy gate DG2 are exposed from the first mask pattern 60', as shown in FIG. 9A. Then, the third polysilicon layers 50 of the erase gate EG and select gates SG, the second polysilicon layers 40 of the dummy control gates DCG and the second polysilicon layer 40 and the first polysilicon layer 30 of the dummy gate DG2 are removed so as to form openings 62, 61 and 63, respectively, as shown in FIG. 9A.

Figure 9B:
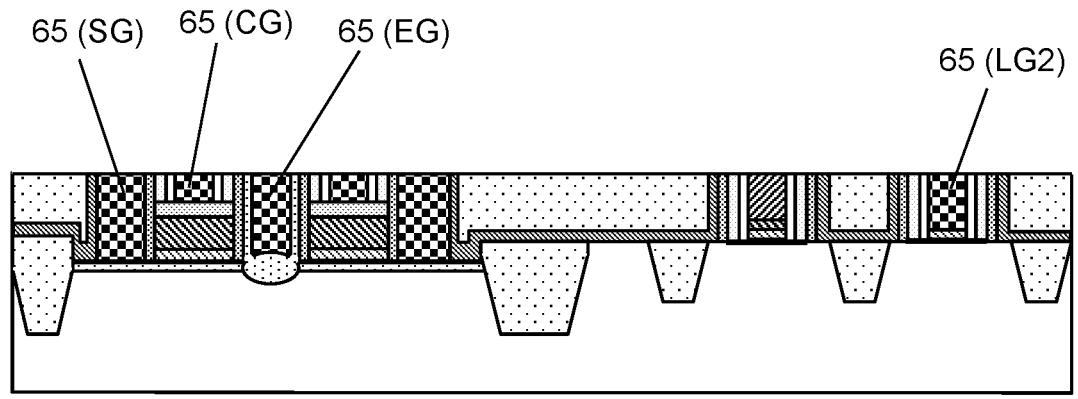

After the openings 62, 61 and 63 are formed, the openings are filled with one or more layers of first conductive material 65, as shown in FIG. 9B, so as to form a metal erase gate EG, metal select gates SG, metal control gates CG and a metal gate LG2. In some embodiments, the first conductive material 65 includes a work function adjustment layer and a body metal layer.

Figure 9C:
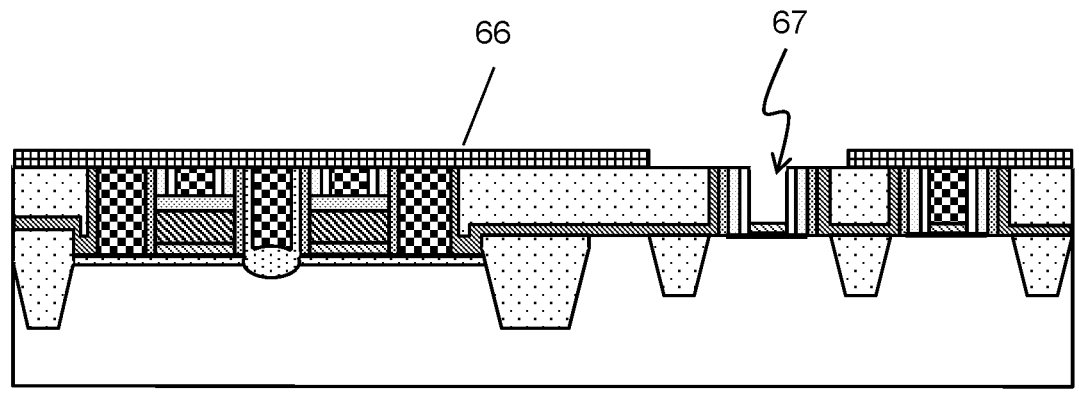
Figure 10A:
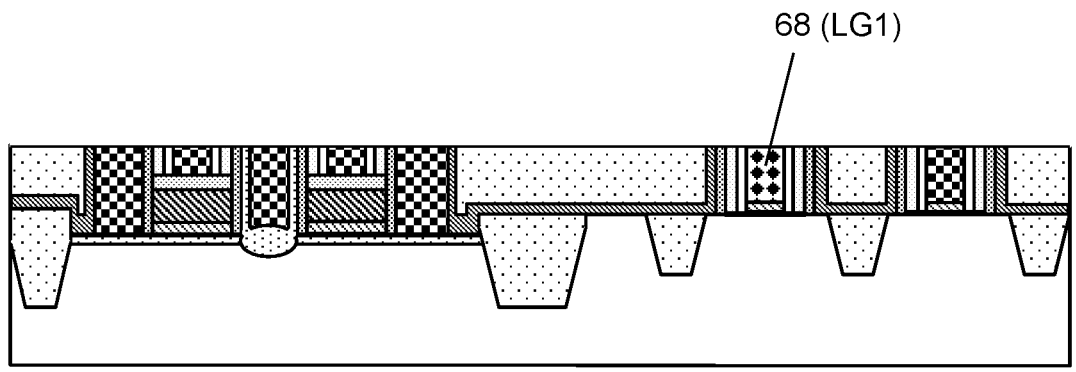
FIGS. 10A-10B show exemplary cross sectional views illustrating a sequential process for manufacturing a semiconductor device including non-volatile memory cells and peripheral logic circuits according to another embodiment of the present disclosure.

Then, similar to FIG. 8A, a second mask pattern 66 is formed so that the upper portion of the dummy gate DG1 is exposed from the second mask pattern 66, and the second polysilicon layer 40 and first polysilicon layer 30 of the dummy gate DG1 are removed so as to form opening 67, as shown in FIG. 9C. Then, similar to the operations of FIG. 7C or 9B, a second conductive material layer 68 is formed in the opening 67 so as to form a metal gate LG1 for an n-channel FET, as shown in FIG. 10A.

Figure 10B:
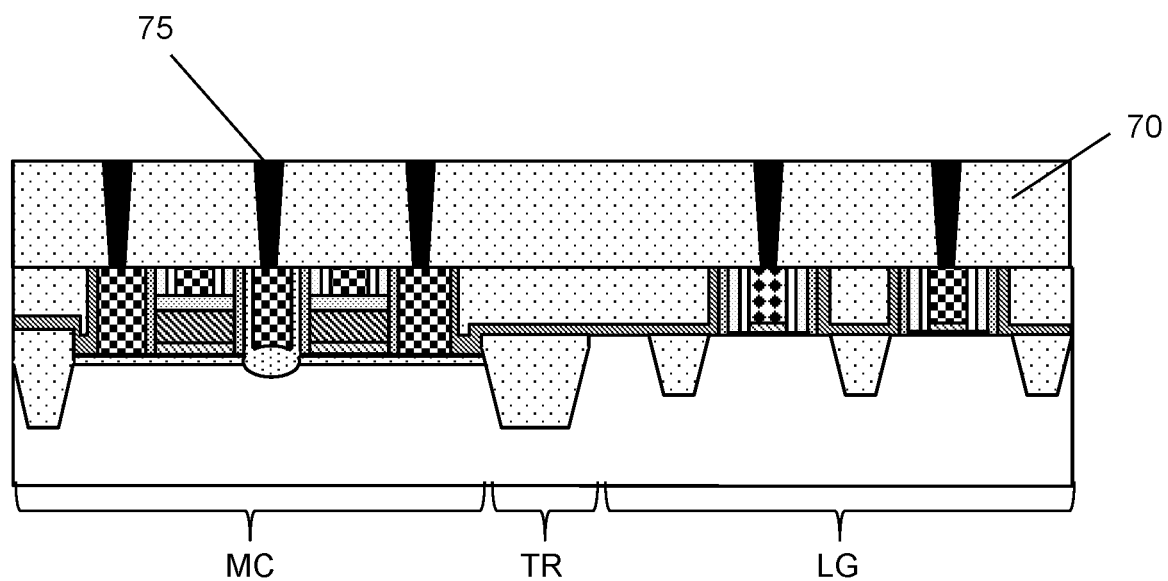

Subsequently, similar to FIG. 8C, an interlayer dielectric (ILD) layer 70 is formed over the structure shown in FIG. 10A and contact plugs 75 are formed, as shown in FIG. 10B.

FIGS. 11A-11C and 12 show exemplary cross sectional views illustrating process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-10B may be employed in the following embodiments, and the detailed explanation thereof may be omitted. In the following embodiments, the upper parts of the erase gate EG and select gates SG formed by the polysilicon layer 50 are dummy patterns to be replaced with metal material.

Figure 11A:
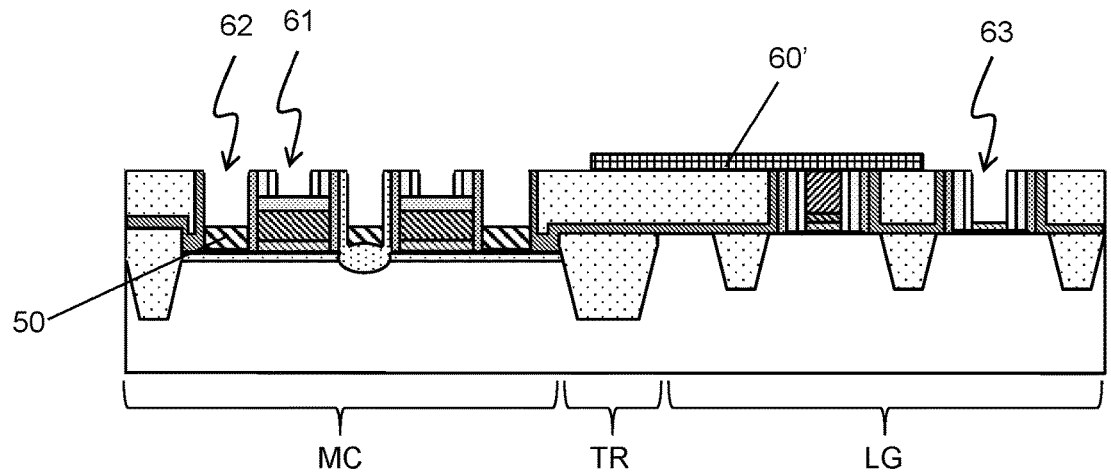
FIGS. 11A, 11B and 11C show exemplary cross sectional views illustrating a sequential process for manufacturing a semiconductor device including non-volatile memory cells and peripheral logic circuits according to another embodiment of the present disclosure.

After the structure of FIG. 7A is formed, a first mask pattern 60' is formed so that the upper portions of the dummy control gates DCG, the erase gate EG and select gates SG and the upper portion of the dummy gate DG2 are exposed from the first mask pattern 60', as shown in FIG. 11A. Then, the third polysilicon layers 50 of the erase gate EG and select gates SG, the second polysilicon layers 40 of the dummy control gates DCG and the second polysilicon layer 40 and the first polysilicon layer 30 of the dummy gate DG2 are removed so as to form openings 62, 61 and 63, respectively, as shown in FIG. 11A.

Unlike the foregoing embodiment shown in FIG. 9A, the third polysilicon layers 50 of the erase gate EG and select gates SG are only partially removed and the third polysilicon layers 50 remain at the bottoms of the openings 62, as shown in FIG. 11A. Since the thickness of the third polysilicon layer 50 is much greater than the thickness of the second polysilicon layer 40 for the dummy control gates DCG and the second and first polysilicon layers 40, 30 for the dummy gate DG2, the third polysilicon layers 50 remain at the bottoms of the openings 62 when the second and first polysilicon layers are fully removed by etching.

Figure 11B:
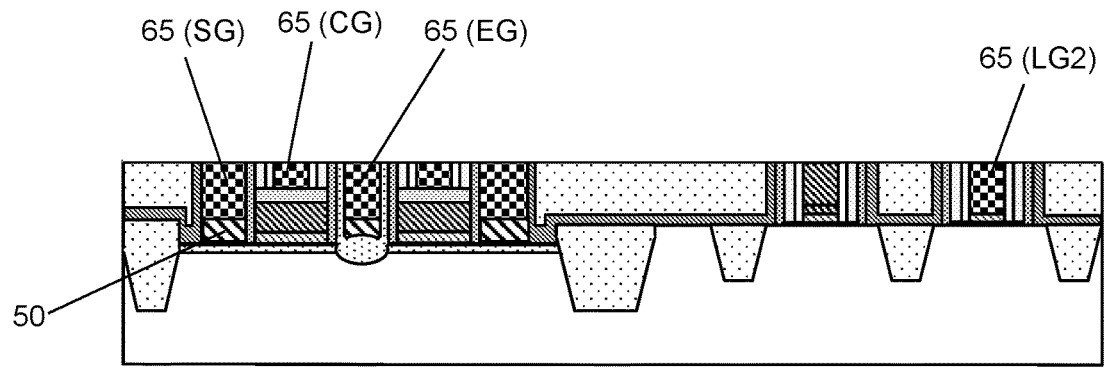
Figure 11C:
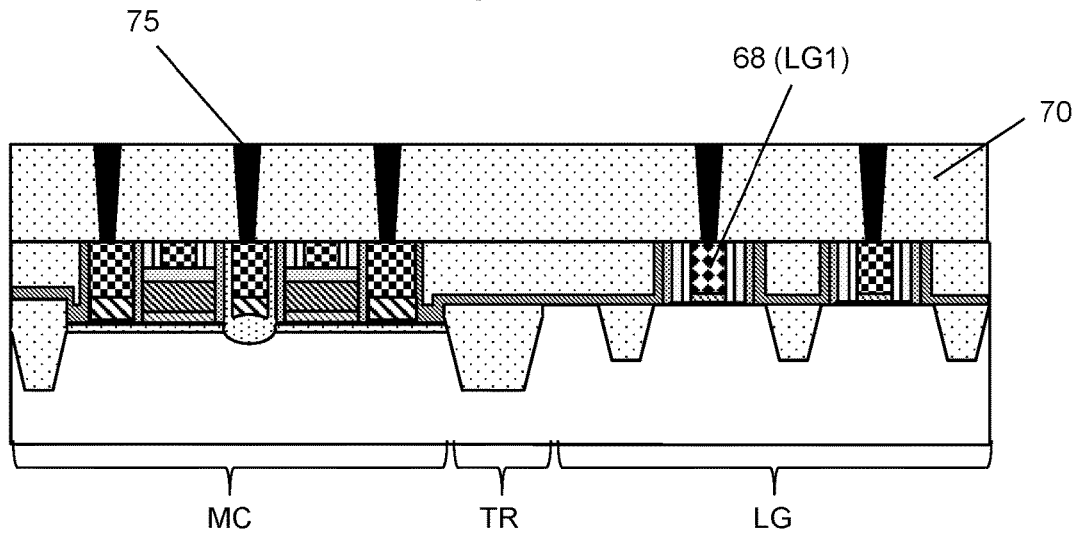

Then, by similar operations described with FIGS. 7C and/or 9B, the metal erase gate EG, the metal select gates SG, the metal control gates CG and the metal gate LG2 for the p-channel FET are formed with the first conductive material 65, as shown in FIG. 11B. Subsequently, by similar operations described with FIGS. 8A-8B and/or 10A-10B, the metal gate LG1 for the n-channel FET is formed with second conductive material 67, and the ILD layer 70 and the contact plugs 75 are formed, as shown in FIG. 11C.

Figure 12:
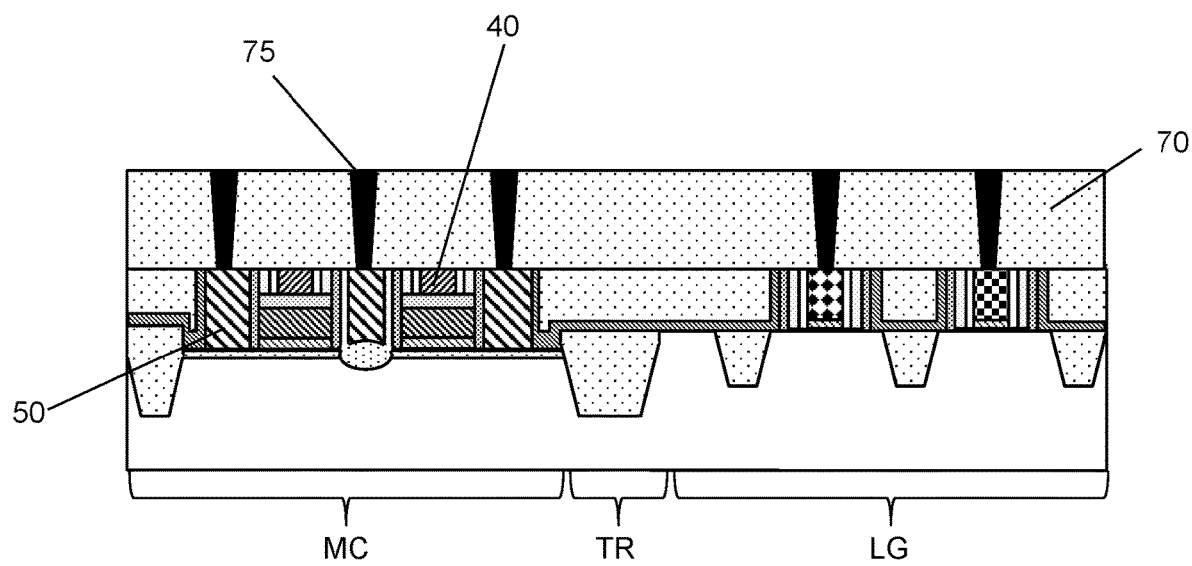
FIG. 12 shows an exemplary cross sectional view illustrating a sequential process for manufacturing a semiconductor device including non-volatile memory cells and peripheral logic circuits according to another embodiment of the present disclosure.

FIG. 12 shows an exemplary cross sectional view illustrating a sequential process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-11C may be employed in the following embodiments, and the detailed explanation thereof may be omitted.

In this embodiment, the polysilicon layers 40 for the control gates and the polysilicon layers 50 for the erase gates and the select gates are not replaced with metal material. Thus, the dummy control gate is an actual control gate. As shown in FIG. 12, the gates of NVM cells are all made of polysilicon, which is appropriately doped for each gate, and do not include metal material used for FETs in the logic circuit area.

In the foregoing embodiments, a non-volatile memory (NVM) cell includes a tunnel oxide layer 21 disposed on a substrate 10, a high-k dielectric layer 23 is formed on the tunnel oxide layer 21, a floating gate FG made of the first polysilicon layer 30 and disposed over the high-k dielectric layer 23, a control gate CG made of the conductive material 65 (or the second polysilicon layer 40), and an dielectric layer 35 disposed between the floating gate FG and the control gate CG. Further, an interfacial silicon oxide layer 22 may be formed between the tunnel oxide layer 21 and the high-k dielectric layer 23.

In the logic circuit area LG, a gate structure for an FET includes the interfacial layer 22 formed on the substrate 10, the high-k dielectric layer 23 formed on the interfacial layer 22 and a conductive material layer 65, 67 formed over the high-k dielectric layer 23.

Further, in the forgoing embodiments, the gate LG1 is for an n-channel FET and the gate LG2 is for a p-channel FET. In certain embodiments, the gate LG1 is for a p-channel FET and the gate LG2 is for an n-channel FET. In such a case, the same conductive material structure 65 is used for the gates of the NVM cells and the gate of the n-channel FET. In other words, the metal gates for the NVM cells has the same conductive metal structure as either one of a p-channel FET or an n-channel FET in the logic circuit area LG.

It will be understood that not all advantages have been necessarily discussed herein, no particular advantage is required for all embodiments or examples, and other embodiments or examples may offer different advantages.

According to some embodiments of the present disclosure, since the control gates of the NVM cells are made of metal material, resistance of the control gates can be reduced. Further, according to some embodiments of the present disclosure, since the erase gate and select gates of the NVM cells are made of metal material, resistance of these gates and contact resistance between the gates and the contact plugs can be reduced. Further, since the gate replacement process is performed for the NVM cell area and the logic circuit area at the same time, it is possible to minimize an increase of the number of lithograph operations. In addition, it is possible to avoid placing dummy structures at the transition area to compensate a height difference between the NVM cell area and the logic circuit area.

In accordance with one aspect of the present disclosure, in a method for manufacturing a semiconductor device including a non-volatile memory, a cell structure is formed. The cell structure includes a stacked structure including a first dielectric layer, a second dielectric layer disposed over the first dielectric layer, a first polysilicon layer as a floating gate disposed over the second dielectric layer, a third dielectric layer disposed over the first polysilicon layer, and a second polysilicon layer disposed over the third dielectric layer. The cell structure further includes third polysilicon layers disposed at both sides of the stacked structure. The second polysilicon layer is removed, thereby forming a control gate space. A conductive material is formed in the control gate space.

In accordance with another aspect of the present disclosure, in a method for manufacturing a semiconductor device including a non-volatile memory disposed in a memory cell area and a field effect transistor disposed in a logic circuit area, a cell structure for the non-volatile memory is formed in the memory cell area. The cell structure comprises a stacked structure including a first dielectric layer, a second dielectric layer disposed over the first dielectric layer, a first polysilicon layer as a floating gate disposed over the second dielectric layer, a third dielectric layer disposed over the first polysilicon layer, and a second polysilicon layer disposed over the third dielectric layer. The cell structure further comprises third polysilicon layers disposed at both sides of the stacked structure. A first dummy gate structure for the field effect transistor is formed in the logic circuit area. The first dummy gate structure comprises a first gate dielectric layer made of a same material as the second dielectric layer, and a first dummy logic gate made of polysilicon and disposed over the first gate dielectric layer. The second polysilicon layer in the memory cell area is removed, thereby forming a control gate space, and the polysilicon of the first dummy logic gate is removed, thereby forming a first logic gate space. A conductive material is formed in the control gate space and the first logic gate space, respectively. The second dielectric layer and the first gate dielectric layer include a dielectric material having a dielectric constant higher than silicon nitride.

In accordance with another aspect of the present disclosure, a semiconductor device includes a non-volatile memory. The non-volatile memory includes a first dielectric layer disposed on a substrate, a floating gate disposed on the dielectric layer, a control gate and a second dielectric layer disposed between the floating gate and the control gate. The second dielectric layer includes one of a silicon oxide layer, a silicon nitride layer and a multi-layer thereof. The first dielectric layer includes a first-first dielectric layer formed on the substrate and a second-first dielectric layer formed on the first-first dielectric layer. The second-first dielectric layer includes a dielectric material having a dielectric constant higher than silicon nitride.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a non-volatile memory, the non-volatile memory comprising:
    a first dielectric layer disposed on a substrate;
    a floating gate disposed on the first dielectric layer;
    a control gate;
    a select gate;
    an erase gate; and
    a second dielectric layer disposed between the floating gate and the control gate, and having one of a silicon nitride layer, a silicon oxide layer and multilayers thereof, wherein:
    the first dielectric layer includes a lower layer made of silicon oxide and an upper layer made of a dielectric material having a dielectric constant higher than the lower layer, and
    the lower layer includes a laterally extending portion that extends under the select gate, as a select gate dielectric layer, and the upper layer does not extend under the select gate.

2. The semiconductor device of claim 1, wherein a thickness of the lower layer in a range from 1 nm to 50 nm.

3. The semiconductor device of claim 2, wherein the upper layer is made of an oxide of one of Hf, Y, Ta, Ti, Al or Zr.

4. The semiconductor device of claim 1, wherein the control gate includes a poly silicon layer.

5. The semiconductor device of claim 4, wherein the control gate includes the poly silicon layer and a metal layer disposed over the polysilicon layer.

6. The semiconductor device of claim 5, wherein:
    each of the erase gate and the select gate includes a metal layer, and
    the metal layer of the control gate is made of a same material as the metal layer of the select gate and the erase gate.

7. The semiconductor device of claim 1, wherein the control gate includes one or more layers of Al, Cu, W, Ti, Ta, TiN, TiAl, TiAlC, TiAlN, TaN, NiSi and CoSi.

8. The semiconductor device of claim 1, wherein the control gate includes a first layer made of one of TaN, TaAlC, TiN, TiC, Co, TiAl, HfTi, TiSi and TaSi, and a second layer disposed over the first layer and made of one or more of Al, Cu, W, Ti, Ta, TiN, TiAl, TiAlC, TiAlN, TaN, NiSi and CoSi.

9. The semiconductor device of claim 1, wherein the control gate includes a first layer made of one of TiAlC, Al, TiAl, TaN, TaAlC, TiN, TiC and Co and a second layer disposed over the first layer and made of one or more of Al, Cu, W, Ti, Ta, TiN, TiAl, TiAlC, TiAlN, TaN, NiSi and CoSi.

10. A semiconductor device comprising:
    a non-volatile memory; and
    a logic circuit including a field effect transistor (FET), wherein:
    the non-volatile memory includes:
        a first dielectric layer disposed on a substrate;
        a floating gate disposed on the first dielectric layer;
        a control gate;
        a select gate;
        an erase gate; and
        a second dielectric layer disposed between the floating gate and the control gate, and having one of a silicon nitride layer, a silicon oxide layer and multilayers thereof, wherein:
    the first dielectric layer includes a lower layer and an upper layer made of a dielectric material having a dielectric constant higher than silicon nitride,
    a gate dielectric layer of the FET includes a lower layer made of a same material as the lower layer of the first dielectric layer and an upper layer made of a same material as the upper layer of the first dielectric layer, and a thickness of the upper layer of the gate dielectric layer of the FET is equal to a thickness of the upper layer of the first dielectric layer.

11. The semiconductor device of claim 10, wherein the upper layer of the first dielectric layer is made of one or more oxides of Hf, Y, Ta, Ti, Al or Zr.

12. The semiconductor device of claim 10, wherein
each of the erase gate and the select gate includes a metal layer, and
a gate electrode of the FET includes a metal layer made of a same material as the metal layer of the erase gate.

13. The semiconductor device of claim 10, wherein a material of a gate electrode of the FET is different from a material of the control gate.

14. The semiconductor device of claim 10, wherein the control gate includes a poly silicon layer.

15. The semiconductor device of claim 10, wherein the control gate includes no polysilicon layer.

16. A non-volatile memory comprising:
an isolation insulating layer embedded in a semiconductor substrate and separating a memory cell area and a logic circuit area;
a first dielectric layer disposed on the semiconductor substrate;
a floating gate disposed on the dielectric layer;
a control gate;
an erase gate;
a select gate;
a second dielectric layer disposed between the floating gate and the control gate, and having one of a silicon oxide layer, a silicon nitride layer and a multi-layer thereof; and
first to third sidewall spacers, wherein:
the first dielectric layer includes:
a first-first dielectric layer formed on the substrate; and
a second-first dielectric layer formed on the first-first dielectric layer and including a dielectric material having a dielectric constant higher than silicon nitride,
the control gate, the erase gate and the select gate includes a conductive layer made of a same material,
the erase gate and the select gate include a polysilicon layer under the conductive layer, and
the control gate includes no polysilicon layer.

17. The non-volatile memory of claim 16, wherein the control gate includes no polysilicon layer and includes one or more layers of TiAl, TiAlC, or TiAlN.

18. The non-volatile memory of claim 16, wherein the control gate, the erase gate and the select gate include a first layer made of one of TaN, TaAlC, TiN, TiC, Co, TiAl, HfTi, TiSi and TaSi, and a second layer disposed over the first layer and made of one or more of Al, Cu, W, Ti, Ta, TiN, TiAl, TiAlC, TiAlN, TaN, NiSi and CoSi.

19. The non-volatile memory of claim 16, wherein the control gate, the erase gate and the select gate include a first layer made of one of TiAlC, Al, TiAl, TaN, TaAlC, TiN, TiC and Co and a second layer disposed over the first layer and made of one or more of Al, Cu, W, Ti, Ta, TiN, TiAl, TiAlC, TiAlN, TaN, NiSi and CoSi.

20. The non-volatile memory of claim 16, wherein the first-first dielectric layer extends below the select gate, and the second-first dielectric layer does not extend below the select gate.

* * * * *